United States Patent
Hong et al.

(10) Patent No.: US 7,856,592 B2
(45) Date of Patent: Dec. 21, 2010

(54) APPARATUS AND METHOD FOR TRANSMITTING/RECEIVING SIGNAL IN A COMMUNICATION SYSTEM

(75) Inventors: Song-Nam Hong, Seoul (KR); Pan-Yuh Joo, Seoul (KR); Jung-Je Son, Seongnam-si (KR); Jae-Weon Cho, Suwon-si (KR); Hyoung-Kyu Lim, Seoul (KR); Yeong-Moon Son, Anyang-si (KR); Sung-Jin Lee, Suwon-si (KR); Joong-Ho Park, Seoul (KR); Mi-Hyun Lee, Seoul (KR); Hyun-Jeong Kang, Seoul (KR); Young-Ho Kim, Suwon-si (KR)

(73) Assignee: Samsung Electronics Co., Ltd (KR)

( * ) Notice: Subject to any disclaimer, the term of this patent is extended or adjusted under 35 U.S.C. 154(b) by 975 days.

(21) Appl. No.: 11/708,701

(22) Filed: Feb. 19, 2007

(65) Prior Publication Data
US 2007/0226584 A1   Sep. 27, 2007

(30) Foreign Application Priority Data
Feb. 20, 2006 (KR) .................. 10-2006-0016286

(51) Int. Cl.
*G06F 11/00* (2006.01)
(52) U.S. Cl. ..................................... 714/800
(58) Field of Classification Search .............. 714/752, 714/790, 800–801, 804
See application file for complete search history.

(56) References Cited

U.S. PATENT DOCUMENTS

| 7,020,829 | B2 | 3/2006 | Eroz et al. |
| 7,178,082 | B2* | 2/2007 | Yu et al. ..................... 714/752 |
| 7,502,987 | B2 | 3/2009 | Kyung et al. |
| 7,617,441 | B2* | 11/2009 | Lee et al. .................... 714/800 |
| 7,757,150 | B2* | 7/2010 | Stolpman .................... 714/752 |
| 2007/0011569 | A1* | 1/2007 | Vila Casado et al. ........ 714/758 |
| 2008/0256425 | A1 | 10/2008 | Oh et al. |
| 2008/0270877 | A1 | 10/2008 | Oh et al. |

FOREIGN PATENT DOCUMENTS

| KR | 1020040030089 | 4/2004 |
| KR | 1020050118056 | 12/2005 |
| KR | 1020050123336 | 12/2005 |
| KR | 1020060010068 | 2/2006 |

* cited by examiner

*Primary Examiner*—Shelly A Chase
(74) *Attorney, Agent, or Firm*—The Farrell Law Firm, LLP

(57) ABSTRACT

A signal transmission/reception apparatus of a communication system. The signal transmission apparatus receives an information vector, encodes the information vector into a structured Low Density Parity Check (LDPC) codeword using a structured LDPC coding scheme, and transmits the generated structured LDPC code to the signal reception apparatus. Then the signal reception apparatus receives a signal, and detects an information vector by decoding the received signal using a decoding scheme corresponding to the structured LDPC coding scheme used in the signal transmission apparatus.

25 Claims, 4 Drawing Sheets

APPARATUS AND METHOD FOR TRANSMITTING/RECEIVING SIGNAL IN A COMMUNICATION SYSTEM

PRIORITY

This application claims the benefit under 35 U.S.C. §119 (a) of a Korean Patent Application filed in the Korean Intellectual Property Office on Feb. 20, 2006 and assigned Serial No. 2006-16286, the entire disclosure of which is incorporated herein by reference.

BACKGROUND OF THE INVENTION

1. Field of the Invention

The present invention relates generally to an apparatus and method for transmitting/receiving signals in a communication system, and in particular, to an apparatus and method for transmitting/receiving signals using a structured Low Density Parity Check (LDPC) code in a communication system.

2. Description of the Related Art

The next generation communication system has evolved into a packet service communication system, and the packet service communication system, which is a system for transmitting burst packet data to a plurality of mobile stations (MSs), has been designed to be suitable for high-capacity data transmission. It is known that the next generation communication system, together with a turbo code as a channel code, has a high performance gain during high-speed data transmissions. Additionally, the next generation communication systems are being designed to utilize the LDPC code that can increase data transmission reliability by efficiently correcting errors caused by noises generated in a transmission channel. The next generation communication system being designed that use the LDPC code includes an Institute of Electrical and Electronics Engineers (IEEE) 802.16e standard-based communication system and an IEEE 802.11n standard-based communication system.

FIG. 1 is a diagram illustrating a structure of a signal transmission apparatus in a general communication system using an LDPC code.

Referring to FIG. 1, the signal transmission apparatus includes an encoder 111, a modulator 113, and a transmitter 115. If an information vector s that the signal transmission apparatus desires to transmit is generated, the information vector s is delivered to the encoder 111. The encoder 111 encodes the information vector s into a codeword vector c, i.e. LDPC codeword, using a predetermined coding scheme, and outputs the codeword vector c to the modulator 113. The coding scheme can be an LDPC coding scheme. The modulator 113 modulates the codeword vector c into a modulation vector m using a predetermined modulation scheme, and outputs the modulation vector m to the transmitter 115. The transmitter 115 performs transmission signal processing on the modulation vector m output from the modulator 113, and transmits the resulting signal to a signal reception apparatus via an antenna ANT.

FIG. 2 is a diagram illustrating structure of a signal reception apparatus in a general communication system using an LDPC code.

Referring to FIG. 2, the signal reception apparatus includes a receiver 211, a demodulator 213, and a decoder 215. A signal transmitted by a signal transmission apparatus is received at the signal reception apparatus via an antenna ANT, and the received signal is delivered to the receiver 211. The receiver 211 performs signal reception processing on the received signal, and outputs the reception-processed received vector r to the demodulator 213. The demodulator 213 demodulates the received vector r output from the receiver 211 into a demodulation vector x using a demodulation scheme corresponding to the modulation scheme used in the modulator 113 of the signal transmission apparatus, and outputs the demodulation vector x to the decoder 215. The decoder 215 decodes the demodulation vector x output from the demodulator 213 using a decoding scheme corresponding to the coding scheme used in the encoder 111 of the signal transmission apparatus, and finally outputs the decoded signal as a restored information vector ŝ.

The LDPC code exhibits performance characteristics that almost approach the channel capacity limit presented by Shannon's channel coding theorem. Actually, however, the communication system has difficulty in using the LDPC code to support a high data rate, because of the following restrictions.

A first restriction is the limited codeword length of the LDPC codeword. An increase in codeword length of the LDPC codeword shows the performance approaching the channel capacity limit in the Shannon's channel coding theorem, but may cause a considerable increase in the decoding complexity. Therefore, the codeword length of the LDPC codeword is limited taking the decoding complexity into account.

A second restriction is the limited maximum degree of a variable node in a Tanner graph of the LDPC code. An increase in the maximum degree of the variable node in the Tanner graph of the LDPC code causes an increase in delay in a decoding process of the LDPC codeword. That is, the maximum degree of the variable node in the Tanner graph of the LDPC code is limited taking into account the delay in the decoding process.

Therefore, there is a need for a signal transmission/reception scheme for supporting a high data rate while overcoming the restrictions for the use of the LDPC code in the communication system using the LDPC code.

SUMMARY OF THE INVENTION

An aspect of the present invention is to address at least the problems and/or disadvantages and to provide at least the advantages described below. Accordingly, an aspect of the present invention is to provide an apparatus and method for transmitting/receiving signals using a structured LDPC code in a communication system.

According to one aspect of the present invention, there is provided a signal transmission/reception apparatus of a communication system. The signal transmission apparatus receives an information vector, encodes the information vector into a structured Low Density Parity Check (LDPC) codeword using a structured LDPC coding scheme, and transmits the generated structured LDPC code to the signal reception apparatus. The signal reception apparatus receives a signal, and detects an information vector by decoding the received signal using a decoding scheme corresponding to the structured LDPC coding scheme used in the signal transmission apparatus.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF PREFERRED EMBODIMENTS

Figure 1:
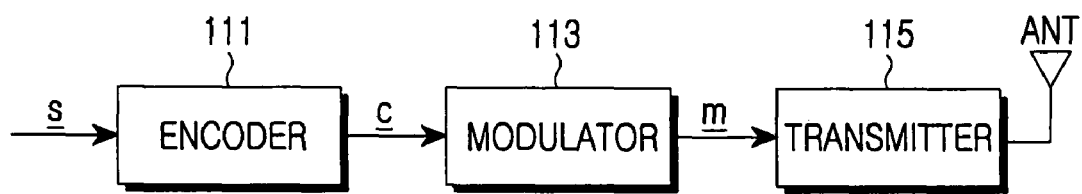
FIG. 1 is a diagram illustrating a structure of a signal transmission apparatus in a general communication system using an LDPC code.

Preferred embodiments of the present invention will now be described in detail with reference to the annexed drawings. In the following description, a detailed description of known functions and configurations incorporated herein has been omitted for clarity and conciseness.

The present invention provides an apparatus and method for transmitting/receiving signals using a structured Low Density Parity Check (LDPC) code as a channel code in a communication system. The present invention provides an apparatus and method for transmitting/receiving signals using a structured LDPC code so as to support a high data rate while overcoming the restrictions for the use of the LDPC code, such as the limited codeword length of the LDPC codeword and the limited maximum degree of a variable node in a Tanner graph of the LDPC code, in the communication system. Although not separately illustrated herein, an operation of transmitting/receiving signals using a structured LDPC code, provided in the present invention, can also be applied to the signal transmission apparatus and the signal reception apparatus of the communication system, described in FIGS. 1 and 2.

Generally, an LDPC code exhibits performance characteristics that almost approach the channel capacity limit presented by Shannon's channel coding theorem. In order to generate the high-performance LDPC code, cycles and degree distribution in a Tanner graph of the LDPC code should be taken into consideration, and in particular, maximization of the girth in the Tanner graph should be taken into account. The term "girth" refers to the minimum cycle length in the Tanner graph of a parity check matrix of the LDPC code. The reason why the maximization of the girth in the Tanner graph should be taken into account is because an increase in the cycle generated in the Tanner graph generally contributes to prevention of performance degradation such as error floor which may occur when there many short-length cycles, for example, length-4 cycles, in the Tanner graph.

Therefore, extensive research is being conducted on the schemes for generating parity check matrixes in such a way that short-length cycles in the Tanner graph are not generated. The typical schemes include a first scheme for removing short-length cycles from a given random LDPC code, and a second scheme for generating an LDPC code having no short-length cycle using an algebraic method. The first scheme needs high memory capacity to store parity check matrixes, and has difficulty in performing efficient LDPC coding. Therefore, the second scheme is generally used. An LDPC code generated using the second scheme is herein referred to as a structured LDPC code.

However, even the general structured LDPC code is rarely used for supporting a high data rate, because of the restrictions of the LDPC code, i.e. the limited codeword length and the limited maximum degree of a variable node in a Tanner graph. Therefore, the present invention provides a structured LDPC code that can be used for supporting a high data rate while overcoming the restrictions for the use of the LDPC codes.

Figures 3, 4:
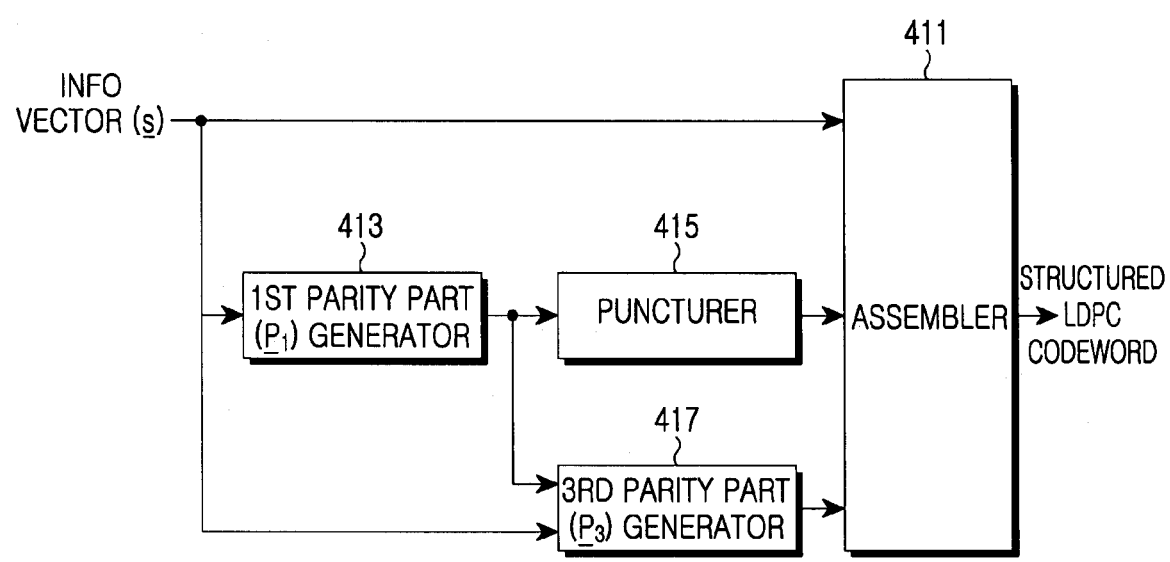
FIG. 3 is a diagram illustrating a parity check matrix of a structured LDPC code according to the present invention.
FIG. 4 is a diagram illustrating an internal structure of an encoder according to the present invention.

FIG. 3 is a diagram illustrating a parity check matrix of a structured LDPC code according to the present invention.

Referring to FIG. 3, the parity check matrix includes a plurality of sub-matrixes, i.e. a sub-matrix A, a sub-matrix B, a sub-matrix D, a sub-matrix T, a sub-matrix 0, and a sub-matrix I. Each of the sub-matrixes includes at least one block matrix.

The structured LDPC codeword includes an information part S corresponding to information bits, and a parity part P corresponding to parity bits, all of which are included in an information vector s. In the structured LDPC codeword, the number of information bits is assumed to be 'n', the number of punctured parity bits is assumed to be '$n_p$', and the number of unpunctured parity bits is assumed to be '$n_{up}$'. The structured LDPC codeword includes $n_{up}$ unpunctured parity bits. A coding rate of the structured LDPC codeword can be expressed as shown in Equation (1):

$$\text{coding rate} = \frac{n + n_{up}}{n} \quad (1)$$

A parity check matrix of the structured LDPC code is a matrix having a size of $(n_{up}+n_p) \times (n+n_{up}+n_p)$, and each of the sub-matrixes can be defined as follows. For convenience, a matrix having a size of a×b will be referred to as an "a×b matrix."

(1) sub-matrix A: $n_{up} \times n$ matrix
(2) sub-matrix B: $n_p \times n$ matrix
(3) sub-matrix D: $n_{up} \times n_{up}$ matrix
(4) sub-matrix T: $n_p \times n_{up}$ matrix
(5) sub-matrix 0: $n_{up} \times n_p$ matrix
(6) sub-matrix I: $n_p \times n_p$ matrix Of the sub-matrixes, the sub-matrix D, the sub-matrix T, the sub-matrix I and the sub-matrix 0 have a fixed type. That is, the sub-matrix I is an identity matrix, the sub-matrix 0 indicates a zero matrix, and the sub-matrix D and the sub-matrix T indicate matrixes of Equation (2) and Equation (3), respectively.

$$D = \begin{pmatrix} 1 & 0 & 0 & 0 & 0 \\ 1 & 1 & 0 & 0 & 0 \\ 0 & 1 & 1 & 0 & 0 \\ 0 & 0 & 1 & 1 & 0 \\ 0 & 0 & 0 & 1 & 1 \end{pmatrix} \quad (2)$$

$$T = \begin{pmatrix} 1 & 0 & 0 & 0 & 0 \\ 0 & 1 & 0 & 0 & 0 \\ 0 & 0 & 1 & 0 & 0 \end{pmatrix} \quad (3)$$

Therefore, the sub-matrix D and the sub-matrix T shown Equation (2) and Equation (3) are generated on the assumption that $n_p=3$ and $n_{up}=5$. As shown in Equation (2), the sub-matrix D is a dual-diagonal matrix.

The structured LDPC code proposed by the present invention is defined by a parameter set $(d_{v1}, d_{v2}, d_{c1}, d_{c2}, n_p)$.

$d_{v1}$ is a parameter indicating the number of elements not having a value of 0 per column of the sub-matrix A. For convenience, the element not having a value of 0 will be assumed herein as an element having a value of '1'. That is, $d_{v1}$ is a parameter indicating the number of elements having a value of 1 per column of the sub-matrix A, and each column in the sub-matrix A includes $d_{v1}$ elements having a value of 1.

$d_{v2}$ is a parameter indicating the number of elements having a value of 1 per column of the sub-matrix B. That is, each column in the sub-matrix B includes $d_{v2}$ elements having a value of 1.

$d_{c1}$ is a parameter indicating the number of elements having a value of 1 per row of the sub-matrix A. That is, each row in the sub-matrix A includes $d_{c1}$ elements having a value of 1.

$d_{c2}$ is a parameter indicating the number of elements having a value of 1 per row of the sub-matrix B. That is, each row in the sub-matrix B includes $d_{c2}$ elements having a value of 1.

A relationship between the variables $n$, $n_p$ and $n_{up}$, and the parameter set ($d_{v1}$, $d_{v2}$, $d_{c1}$, $d_{c2}$, $n_p$) is given as shown in Equation (4):

$$n \cdot d_{v1} = n_{up} \cdot d_{c1} \quad (4)$$

The sub-matrix A does not include any column in which values of all elements are 0. In the sub-matrix B, $$\frac{(n_p d_{c2})}{d_{v2}}$$

columns include $d_{v2}$ elements having a value of 1, and ($n_p - d_{v2}$) elements having a value of 0. Further, in the sub-matrix B, the remaining columns except for $$\frac{(n_p d_{c2})}{d_{v2}}$$

columns are columns in which values of all elements are 0.

Structures of the sub-matrixes, i.e. the sub-matrix A, the sub-matrix B, the sub-matrix D, the sub-matrix T, the sub-matrix 0, and the sub-matrix I are determined as described above. The number of elements having a value of 1 for columns and rows of each of the sub-matrixes, and the number of columns whose all elements have a value of 1, are determined.

In the parity check matrix of the structured LDPC code, positions of the elements having a value of 1 should also be determined. Similarly, the positions of the elements having a value of 1 are determined as done in the parity check matrix of the general LDPC code. That is, the positions of the elements having a value of 1 should be determined taking into account the cycles in the Tanner graph of the structured LDPC code, and a method for determining positions of the elements having a value of 1 taking the cycles into account is well known in the art and is not so directly related to the present invention that a detailed description thereof will be omitted herein.

Each parameter in the parameter set ($d_{v1}$, $d_{v2}$, $d_{c1}$, $d_{c2}$, $n_p$) is determined by a density evolution scheme. The density evolution scheme is also well known in the art and is not so directly related to the present invention that detailed description thereof will be omitted herein.

FIG. 4 is a diagram illustrating an internal structure of an encoder according to the present invention.

It should be noted that the encoder shown in FIG. 4 corresponds to the encoder 111 described in FIG. 1, but its structured LDPC coding scheme corresponding to the structured LDPC code proposed by the present invention is different from the coding scheme of the encoder 111.

Referring to FIG. 4, the encoder includes an assembler 411, a first parity part ($p_1$) generator 413, a puncturer 415, a third parity part ($p_3$) generator 417.

If a transmission information vector s is generated, the information vector s is delivered to the assembler 411, the first parity part ($p_1$) generator 413, and the third parity part ($p_3$) generator 417. The first parity part ($p_1$) generator 413 generates, from the information vector s, a first parity part $p_1$ using a sub-matrix A and a sub-matrix D among a plurality of sub-matrixes included in a parity check matrix of the structured LDPC code, and outputs the generated first parity part $p_1$ to the puncturer 415 and the third parity part ($p_3$) generator 417.

If it is assumed that the information vector s is an n×1 column vector and the first parity part $p_1$ is a $n_{up}$×1 column vector, the first parity part $p_1$ is generated so as to satisfy. Equation (5) below.

$$As + Dp_1 = 0 \quad (5)$$

In Equation (5), '+' denotes an exclusive OR (XOR) operation in a binary field.

However, because the sub-matrix D has a dual-diagonal structure, it can be understood that the operation shown in Equation (5) is simple and is performed fast, resulting in an increase in generation speed of the structure LDPC codeword.

Assume that the sub-matrix A corresponds to a matrix shown in Equation (6) below and the sub-matrix D corresponds to a matrix shown in Equation (2).

$$A = \begin{pmatrix} 1 & 0 & 1 & 0 & 0 \\ 0 & 1 & 0 & 0 & 1 \\ 0 & 0 & 1 & 1 & 0 \\ 0 & 0 & 0 & 1 & 0 \\ 0 & 1 & 0 & 0 & 1 \end{pmatrix} \quad (6)$$

If the information vector s is assumed as (01001), the first parity part $p_1$ is generated as shown in Equation (7) below. Each of elements of the information vector s will be referred to as s(i), and each of elements of the first parity part $p_1$ will be referred to as $p_1(i)$.

$$p(1) = s(1) + s(3) \bmod 2 = 0 + 0 = 0$$

$$p(2) = s(2) + s(5) + p(1) \bmod 2 = 1 + 1 + 0 = 0$$

$$p(3) = s(3) + s(4) + p(2) \bmod 2 = 0 + 0 + 0 = 0$$

$$p(4) = s(4) + s(3) \bmod 2 = 0 + 0 = 0$$

$$p(5) = s(2) + s(5) + p(3) \bmod 2 = 1 + 1 + 0 = 0 \quad (7)$$

In Equation (7), 'mod' denotes a modulo operation.

The puncturer 415 generates a second parity part $p_2$ by puncturing corresponding parity bits from the first parity part $p_1$ output from the first parity part ($p_1$) generator 413 according to a predetermined puncturing pattern, and outputs the second parity part $p_2$ to the assembler 411.

The third parity part ($p_3$) generator 417 receives the information vector s and the first parity part $p_1$, generates a third parity part $p_3$ using the sub-matrix B, the sub-matrix T and the sub-matrix I among the plurality of sub-matrixes included in the parity check matrix of the structured LDPC code, and outputs the third parity part $p_3$ to the assembler 411.

If the third parity part $p_3$ is assumed as an $n_p \times 1$ column vector, the third parity part $p_3$ is generated so as to satisfy Equation (8).

$$Bs + Tp_1 + Ip_3 = 0 \qquad (8)$$

The assembler 411 generates an information part S using the intact information vector s, and assembles a structured LDPC codeword using the information part S, the second parity part $p_2$ and the third parity part $p_3$.

Figure 5:
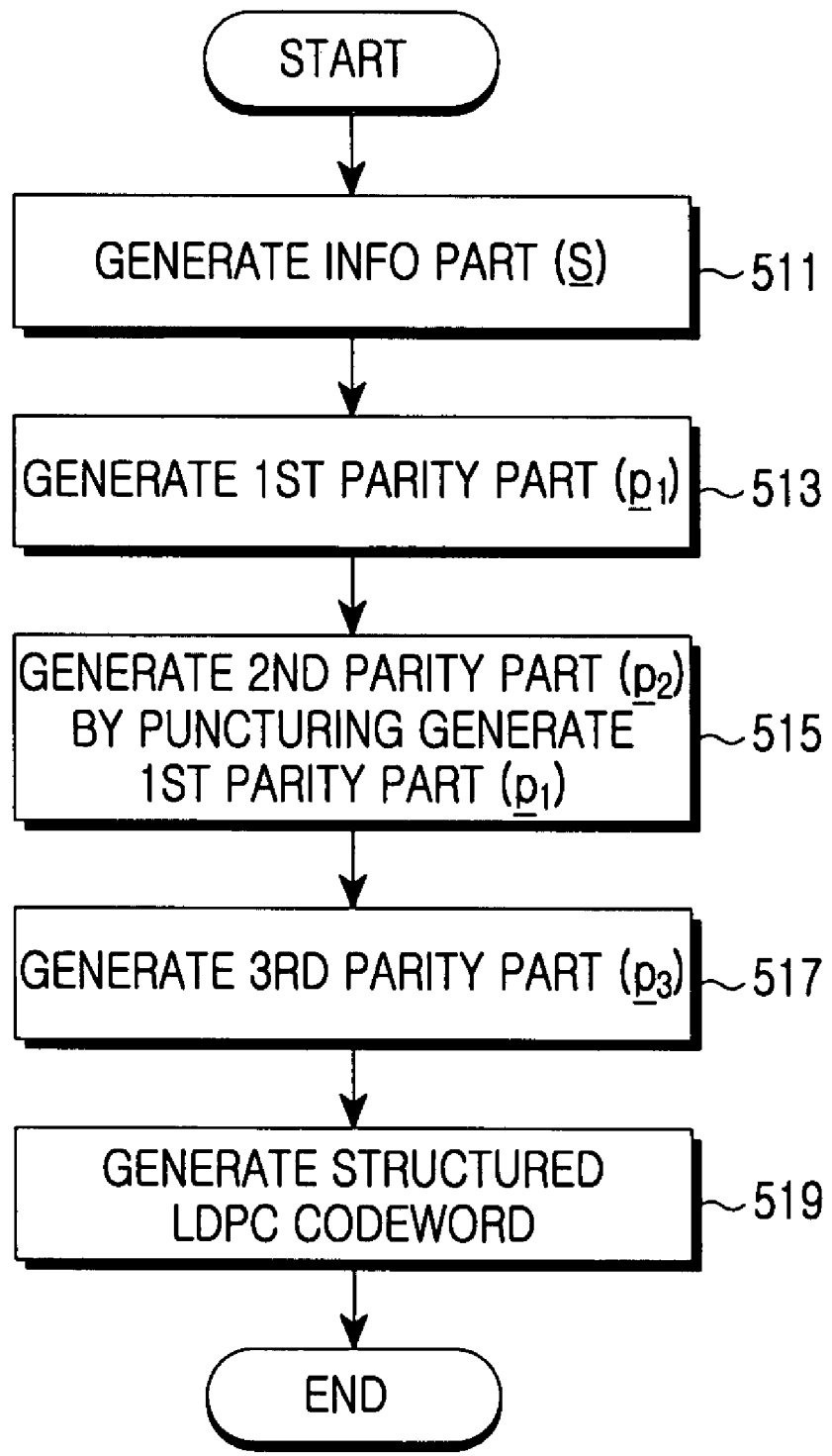
FIG. 5 is a flowchart illustrating a structured LDPC codeword generation process according to the present invention.

FIG. 5 is a flowchart illustrating a structured LDPC codeword generation process according to the present invention.

Referring to FIG. 5, in step 511, an encoder generates an information part S using an intact information vector s. In step 513, the encoder generates a first parity part $p_1$ using a sub-matrix A and a sub-matrix D among a plurality of sub-matrixes included in a parity check matrix of a structured LDPC code. An operation of generating the first parity part $p_1$ has been described in FIG. 4.

In step 515, the encoder generates a second parity part $p_2$ by puncturing corresponding parity bits from the generated first parity part $p_1$ according to a predetermined puncturing pattern. In step 517, the encoder generates a third parity part $p_3$ using a sub-matrix B, a sub-matrix T and a sub-matrix I among the plurality of sub-matrixes included in the parity check matrix of the structured LDPC code. An operation of generating the third parity part $p_3$ has been described in FIG. 4.

In step 519, the encoder generates a structured LDPC codeword by assembling the information part S, the second parity part $p_2$ and the third parity part $p_3$.

Figure 6:
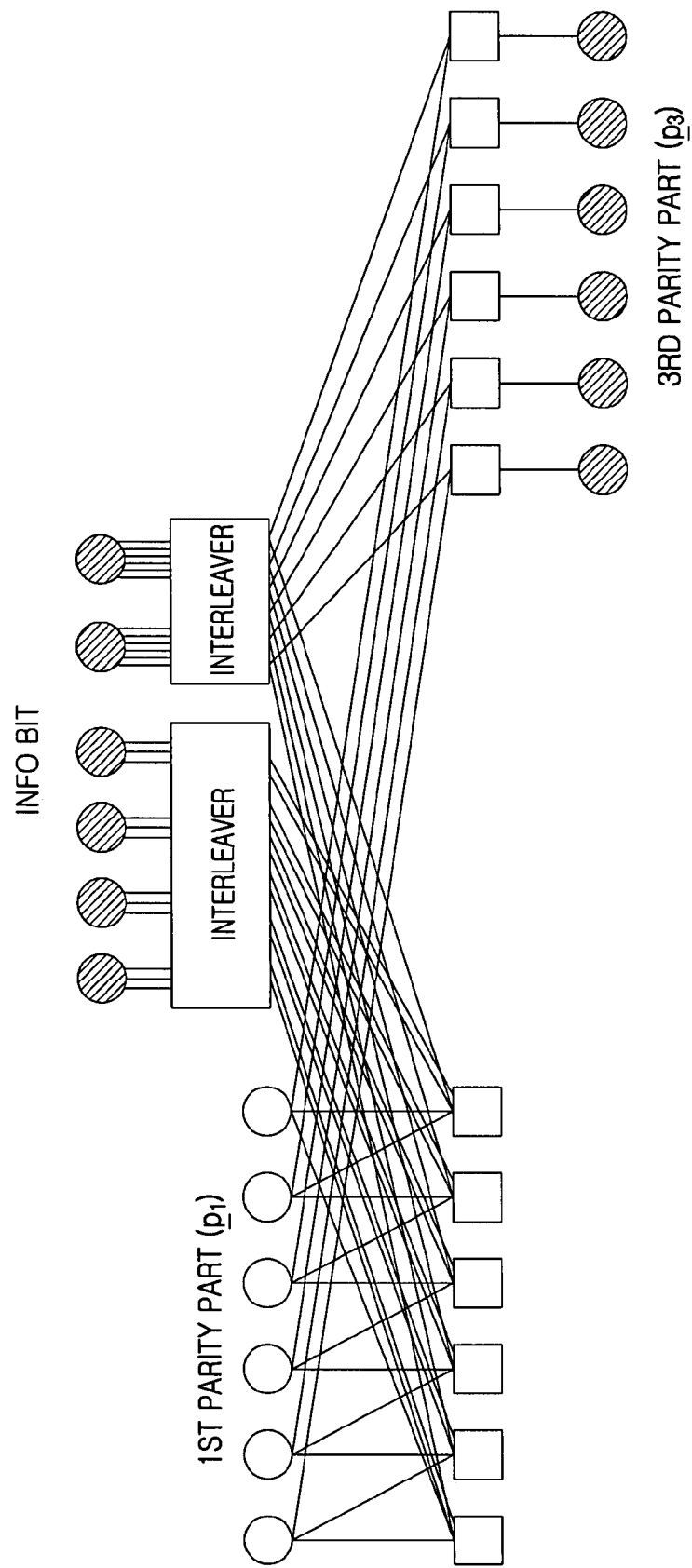
FIG. 6 is a diagram illustrating a Tanner graph of a structured LDPC code with coding rate=½ according to the present invention.

FIG. 6 is a diagram illustrating a Tanner graph of a structured LDPC code with coding rate=½ according to the present invention.

As illustrated in FIG. 6, because all parity bits included in a first parity part $p_1$ are punctured, a second parity part $p_2$ is a zero (0) vector. In addition, because the number of information bits included in an information vector s is 6 and the number of parity bits included in the structured LDPC code, i.e. the number of parity bits included in a third parity part $p_3$, is also 6, a coding rate of the structured LDPC code is ½. In FIG. 6, an interleaver performs an operation of determining positions of elements having a value of 1 in a sub-matrix A and a sub-matrix B among sub-matrixes of the structured LDPC code, and it is not so directly related to the present invention that a detailed description thereof will be omitted herein.

Figure 2:
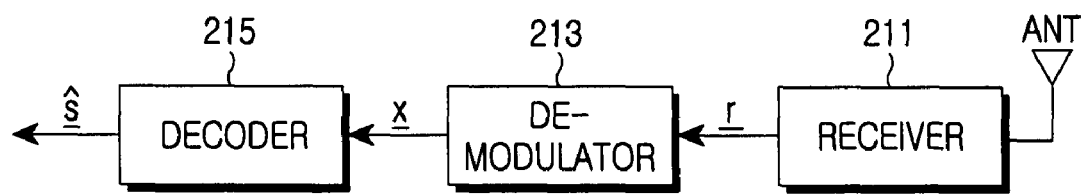
FIG. 2 is a diagram illustrating structure of a signal reception apparatus in a general communication system using an LDPC code.

Although not separately illustrated, a decoder of a signal reception apparatus corresponding to the signal transmission apparatus corresponds to the decoder 215 described in FIG. 2, but its decoding scheme corresponding to the structured LDPC coding scheme proposed by the present invention is different from the decoding scheme of the decoder 215.

As can be understood from the foregoing description, the communication system according to the present invention can transmit/receive signals using a structured LDPC code so as to support a high data rate while overcoming the restrictions for the use of the LDPC code. In addition, the communication system according to the present invention can generate a structured LDPC code that contributes to a decrease in operation complexity and an increase in coding rate.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method for transmitting a signal in a signal transmission apparatus of a communication system, the method comprising:
   receiving an information vector; and
   encoding the information vector into a structured Low Density Parity Check (LDPC) codeword using a structured LDPC coding scheme,
   wherein the structured LDPC coding scheme is a scheme for encoding the information vector into the structured LDPC codeword according to a parity check matrix, the parity check matrix includes a sub-matrix A, a sub-matrix B, a sub-matrix D, a sub-matrix T, a sub-matrix 0 and a sub-matrix I, positions of the sub-matrixes are

| A | D | 0 |
|---|---|---|
| B | T | I | and the sub-matrix D has a dual-diagonal structure.

2. The method of claim 1, further comprising transmitting the generated structured LDPC codeword to a signal reception apparatus.

3. The method of claim 1, wherein in the structured LDPC codeword, the number of information bits included in the information vector is denoted by 'n', the number of punctured parity bits is denoted by '$n_p$', the number of unpunctured parity bits is denoted by $n_{up}$, and a size of the parity check matrix is $(n_{up}+n_p) \times (n+n_{up}+n_p)$;
   wherein the structured LDPC code is defined by a parameter set $(d_{v1}, d_{v2}, d_{c1}, d_{c2}, n_p)$, the parameter $d_{v1}$ indicates the number of elements not having a value of 0 per column of the sub-matrix A, the parameter $d_{v2}$ indicates the number of elements not having a value of 0 per column of the sub-matrix B, the parameter $d_{c1}$ indicates the number of elements not having a value of 0 per row of the sub-matrix A, the parameter $d_{c2}$ indicates the number of elements not having a value of 0 per row of the sub-matrix B, and a relationship between the variables n, $n_p$ and $n_{up}$, and the parameter set $(d_{v1}, d_{v2}, d_{c1}, d_{c2}, n_p)$ is defined as $$n \cdot d_{v1} = n_{up} \cdot d_{c1}.$$

4. The method of claim 3, wherein for $n_p=3$ and $n_{up}=5$, the sub-matrix D and the sub-matrix T are expressed as $$D = \begin{pmatrix} 1 & 0 & 0 & 0 & 0 \\ 1 & 1 & 0 & 0 & 0 \\ 0 & 1 & 1 & 0 & 0 \\ 0 & 0 & 1 & 1 & 0 \\ 0 & 0 & 0 & 1 & 1 \end{pmatrix} \text{ and } T = \begin{pmatrix} 1 & 0 & 0 & 0 & 0 \\ 0 & 1 & 0 & 0 & 0 \\ 0 & 0 & 1 & 0 & 0 \end{pmatrix}.$$

5. The method of claim 3, wherein the encoding of the information vector into the structured LDPC codeword comprises:
   generating an information part from the information vector;
   generating a first parity part from the information vector using the sub-matrix A and the sub-matrix D;
   generating a second parity part by puncturing the first parity part according to a puncturing pattern;
   generating a third parity part from the information vector and the first parity part using the sub-matrix B, the sub-matrix T, and the sub-matrix I; and generating the structured LDPC codeword by assembling the information part, the second parity part, and the third parity part.

6. The method of claim 5, wherein the generation of a first parity part comprises:

generating the first parity part so as to satisfy $As+Dp_1=0$ if the information vector is an n×1 vector and the first parity part is an $n_{up}$×1 vector;

where '+' denotes an exclusive OR operation in a binary field, s denotes the information vector, and $p_1$ denotes the first parity part.

7. The method of claim 5, wherein the generation of a third parity part comprises:

generating the third parity part so as to satisfy $Bs+Tp_1+Ip_3=0$ if the information vector is an n×1 vector, the first parity part is an $n_{up}$×1 vector and the third parity part is an $n_p$×1 vector;

where '+' denotes an exclusive OR operation in a binary field, s denotes the information vector, $p_1$ denotes the first parity part, and $p_3$ denotes the third parity part.

8. An apparatus for transmitting a signal in a communication system, the apparatus comprising:

an encoder for receiving an information vector, and encoding the information vector into a structured Low Density Parity Check (LDPC) codeword using a structured LDPC coding scheme; and a transmitter for transmitting the structured LDPC codeword;

wherein the structured LDPC coding scheme is a scheme for encoding the information vector into the structured LDPC codeword according to a parity check matrix, the parity check matrix includes a sub-matrix A, a sub-matrix B, a sub-matrix D, a sub-matrix T, a sub-matrix 0 and a sub-matrix I, positions of the sub-matrixes are

| A | D | 0 |
|---|---|---|
| B | T | I | and the sub-matrix D has a dual-diagonal structure.

9. The apparatus of claim 8, wherein in the structured LDPC codeword, the number of information bits included in the information vector is denoted by 'n', the number of punctured parity bits is denoted by '$n_p$', the number of unpunctured parity bits is denoted by $n_{up}$, and a size of the parity check matrix is ($n_{up}+n_p$)×(n+$n_{up}+n_p$);

wherein the structured LDPC code is defined by a parameter set ($d_{v1}$, $d_{v2}$, $d_{c1}$, $d_{c2}$, $n_p$), the parameter $d_{v1}$ indicates the number of elements not having a value of 0 per column of the sub-matrix A, the parameter $d_{v2}$ indicates the number of elements not having a value of 0 per column of the sub-matrix B, the parameter $d_{c1}$ indicates the number of elements not having a value of 0 per row of the sub-matrix A, the parameter $d_{c2}$ indicates the number of elements not having a value of 0 per row of the sub-matrix B, and a relationship between the variables n, $n_p$ and $n_{up}$, and the parameter set ($d_{v1}$, $d_{v2}$, $d_{c1}$, $d_{c2}$, $n_p$) is given as $n \cdot d_{v1} = n_{up} \cdot d_{c1}$.

10. The apparatus of claim 9, wherein for $n_p$=3 and $n_{up}$=5, the sub-matrix D and the sub-matrix T are expressed as $$D = \begin{pmatrix} 1 & 0 & 0 & 0 & 0 \\ 1 & 1 & 0 & 0 & 0 \\ 0 & 1 & 1 & 0 & 0 \\ 0 & 0 & 1 & 1 & 0 \\ 0 & 0 & 0 & 1 & 1 \end{pmatrix} \text{ and } T = \begin{pmatrix} 1 & 0 & 0 & 0 & 0 \\ 0 & 1 & 0 & 0 & 0 \\ 0 & 0 & 1 & 0 & 0 \end{pmatrix}.$$

11. The apparatus of claim 9, wherein the encoder comprises:

a first parity part generator for generating a first parity part from the information vector using the sub-matrix A and the sub-matrix D;

a puncturer for generating a second parity part by puncturing the first parity part according to a puncturing pattern;

a third parity part generator for generating a third parity part from the information vector and the first parity part using the sub-matrix B, the sub-matrix T, and the sub-matrix I; and an assembler for generating an information part from the information vector, and generating the structured LDPC codeword by assembling the information part, the second parity part, and the third parity part.

12. The apparatus of claim 11, wherein the first parity part generator generates the first parity part so as to satisfy $As+Dp_1=0$ if the information vector is an n×1 vector and the first parity part is an $n_{up}$×1 vector, where '+' denotes an exclusive OR operation in a binary field, s denotes the information vector, and $p_1$ denotes the first parity part.

13. The apparatus of claim 11, wherein the third parity part generator generates the third parity part so as to satisfy $Bs+Tp_1+Ip_3=0$ if the information vector is an n×1 vector, the first parity part is an $n_{up}$×1 vector and the third parity part is an $n_p$×1 vector, where '+' denotes an exclusive OR operation in a binary field, s denotes the information vector, $p_1$ denotes the first parity part, and $p_3$ denotes the third parity part.

14. A method for receiving a signal in a signal reception apparatus of a communication system, the method comprising:

receiving a signal; and detecting an information vector by decoding the received signal using a decoding scheme corresponding to a structured Low Density Parity Check (LDPC) coding scheme used in a signal transmission apparatus;

wherein the structured LDPC coding scheme is a scheme for encoding the information vector into the structured LDPC codeword according to a parity check matrix, the parity check matrix includes a sub-matrix A, a sub-matrix B, a sub-matrix D, a sub-matrix T, a sub-matrix 0 and a sub-matrix I, positions of the sub-matrixes are

| A | D | 0 |
|---|---|---|
| B | T | I | and the sub-matrix D has a dual-diagonal structure.

15. The method of claim 14, wherein in the structured LDPC codeword, the number of information bits included in the information vector is denoted by 'n', the number of punctured parity bits is denoted by '$n_p$', the number of unpunctured parity bits is denoted by $n_{up}$, and a size of the parity check matrix is $(n_{up}+n_p) \times (n+n_{up}+n_p)$;

wherein the structured LDPC code is defined by a parameter set $(d_{v1}, d_{v2}, d_{c1}, d_{c2}, n_p)$, the parameter $d_{v1}$ indicates the number of elements not having a value of 0 per column of the sub-matrix A, the parameter $d_{v2}$ indicates the number of elements not having a value of 0 per column of the sub-matrix B, the parameter $d_{c1}$ indicates the number of elements not having a value of 0 per row of the sub-matrix A, the parameter $d_{c2}$ indicates the number of elements not having a value of 0 per row of the sub-matrix B, and a relationship between the variables n, $n_p$ and $n_{up}$, and the parameter set $(d_{v1}, d_{v2}, d_{c1}, d_{c2}, n_p)$ is given as $$n \cdot d_{v1} = n_{up} \cdot d_{c1}.$$

16. The method of claim 15, wherein for $n_p=3$ and $n_{up}=5$, the sub-matrix D and the sub-matrix T are expressed as $$D = \begin{pmatrix} 1 & 0 & 0 & 0 & 0 \\ 1 & 1 & 0 & 0 & 0 \\ 0 & 1 & 1 & 0 & 0 \\ 0 & 0 & 1 & 1 & 0 \\ 0 & 0 & 0 & 1 & 1 \end{pmatrix} \text{ and } T = \begin{pmatrix} 1 & 0 & 0 & 0 & 0 \\ 0 & 1 & 0 & 0 & 0 \\ 0 & 0 & 1 & 0 & 0 \end{pmatrix}.$$

17. The method of claim 15, wherein the structured LDPC codeword is generated by:
   generating an information part from the information vector;
   generating a first parity part from the information vector using the sub-matrix A and the sub-matrix D;
   generating a second parity part by puncturing the first parity part according to a puncturing pattern;
   generating a third parity part from the information vector and the first parity part using the sub-matrix B, the sub-matrix T, and the sub-matrix I; and
   assembling the information part, the second parity part, and the third parity part.

18. The method of claim 17, wherein the first parity part is generated so as to satisfy $$As + Dp_1 = 0$$

if the information vector is an n×1 vector and the first parity part is an $n_{up}$3 1 vector, where '+' denotes an exclusive OR operation in a binary field, s denotes the information vector, and $p_1$ denotes the first parity part.

19. The method of claim 17, wherein the third parity part is generated so as to satisfy $$Bs + Tp_1 + Ip_3 = 0$$

if the information vector is an n×1 vector, the first parity part is an $n_{up} \times 1$ vector and the third parity part is an $n_p \times 1$ vector, where '+' denotes an exclusive OR operation in a binary field, s denotes the information vector, $p_1$ denotes the first parity part, and $p_3$ denotes the third parity part.

20. An apparatus for receiving a signal in a communication system, the apparatus comprising:
   a receiver for receiving a signal; and
   a decoder for detecting an information vector by decoding the received signal using a decoding scheme corresponding to a structured Low Density Parity Check (LDPC) coding scheme used in a signal transmission apparatus;

wherein the structured LDPC coding scheme is a scheme for encoding the information vector into the structured LDPC codeword according to a parity check matrix, the parity check matrix includes a sub-matrix A, a sub-matrix B, a sub-matrix D, a sub-matrix T, a sub-matrix 0 and a sub-matrix I, positions of the sub-matrixes

| A | D | 0 |
|---|---|---|
| B | T | I | and the sub-matrix D has a dual-diagonal structure.

21. The apparatus of claim 20, wherein in the structured LDPC codeword, the number of information bits included in the information vector is denoted by 'n', the number of punctured parity bits is denoted by '$n_p$', the number of unpunctured parity bits is denoted by $n_{up}$, and a size of the parity check matrix is $(n_{up}+n_p) \times (n+n_{up}+n_p)$;

wherein the structured LDPC code is defined by a parameter set $(d_{v1}, d_{v2}, d_{c1}, d_{c2}, n_p)$, the parameter $d_{v1}$ indicates the number of elements not having a value of 0 per column of the sub-matrix A, the parameter $d_{v2}$ indicates the number of elements not having a value of 0 per column of the sub-matrix B, the parameter $d_{c1}$ indicates the number of elements not having a value of 0 per row of the sub-matrix A, the parameter $d_{c2}$ indicates the number of elements not having a value of 0 per row of the sub-matrix B, and a relationship between the variables n, $n_p$ and $n_{up}$, and the parameter set $(d_{v1}, d_{v2}, d_{c1}, d_{c2}, n_p)$ is given as the following equation;

$$n \cdot d_{v1} = n_{up} \cdot d_{c1}.$$

22. The apparatus of claim 21, wherein for $n_p=3$ and $n_{up}=5$, the sub-matrix D and the sub-matrix T are expressed as $$D = \begin{pmatrix} 1 & 0 & 0 & 0 & 0 \\ 1 & 1 & 0 & 0 & 0 \\ 0 & 1 & 1 & 0 & 0 \\ 0 & 0 & 1 & 1 & 0 \\ 0 & 0 & 0 & 1 & 1 \end{pmatrix} \text{ and } T = \begin{pmatrix} 1 & 0 & 0 & 0 & 0 \\ 0 & 1 & 0 & 0 & 0 \\ 0 & 0 & 1 & 0 & 0 \end{pmatrix}.$$

23. The apparatus of claim 21, wherein the structured LDPC codeword is generated by:
   generating an information part from the information vector;
   generating a first parity part from the information vector using the sub-matrix A and the sub-matrix D;
   generating a second parity part by puncturing the first parity part according to a puncturing pattern;
   generating a third parity part from the information vector and the first parity part using the sub-matrix B, the sub-matrix T, and the sub-matrix I; and
   assembling the information part, the second parity part, and the third parity part.

24. The apparatus of claim 23, wherein the first parity part is generated so as to satisfy $$As + Dp_1 = 0$$

if the information vector is an n×1 vector and the first parity part is an $n_{up} \times 1$ vector, where '+' denotes an exclusive OR operation in a binary field, s denotes the information vector, and $p_1$ denotes the first parity part.

25. The apparatus of claim 23, wherein the third parity part is generated so as to satisfy $$Bs + Tp_1 + Ip_3 = 0$$

if the information vector is an n×1 vector, the first parity part is an $n_{up} \times 1$ vector and the third parity part is an $n_p \times 1$ vector, where '+' denotes an exclusive OR operation in a binary field, s denotes the information vector, $p_1$ denotes the first parity part, and $p_3$ denotes the third parity part.

* * * * *